United States Patent [19]

Gongwer

[11] Patent Number: 5,321,292
[45] Date of Patent: Jun. 14, 1994

[54] VOLTAGE LIMITING DEVICE HAVING IMPROVED GATE-AIDED BREAKDOWN

[75] Inventor: Geoffrey S. Gongwer, Campbell, Calif.

[73] Assignee: Atmel Corporation, San Jose, Calif.

[21] Appl. No.: 962,123

[22] Filed: Oct. 15, 1992

[51] Int. Cl.$^5$ ............................................. H01L 29/68
[52] U.S. Cl. .................................. 257/367; 257/401; 257/776
[58] Field of Search .................... 257/401, 367, 776

[56] References Cited

U.S. PATENT DOCUMENTS 4,949,139 8/1990 Korsh et al. ...................... 357/23.14
5,144,388 9/1992 Sawada et al. ...................... 257/401

Primary Examiner—Edward Wojciechowicz
Attorney, Agent, or Firm—Schneck & McHugh

[57] ABSTRACT

A voltage limiting device having gate and drain electrodes that include a serpentine configuration to form a pattern of breakdown corners at the traversals of the gate electrode over the drain electrode. The serpentine configuration may define a plurality of fingers. The number of breakdown corners determines the current-voltage (I-V) characteristics of the voltage limiting device. Either one of the gate electrode or the drain electrode may be configured in a manner to provide repeated traversals of one electrode over the other.

17 Claims, 5 Drawing Sheets

5,321,292

VOLTAGE LIMITING DEVICE HAVING IMPROVED GATE-AIDED BREAKDOWN

TECHNICAL FIELD

The present invention relates generally to voltage limiting devices in MOS transistors and more particularly to improving the current-voltage characteristics of such devices.

BACKGROUND ART

Circuits and devices for regulating a voltage level of a control signal in MOS transistors or the like are known. Voltage limiting devices and circuits may be used for protecting an EPROM or EEPROM or arrays of such devices, as in a PLD. During programming of an EPROM or EEPROM, a voltage limiting device controls the program voltage to prevent damage or misprogramming that could occur if the program voltage were to be allowed to increase beyond a predetermined value. Other applications for voltage limiting devices include use with structures, such as a transmission gate transistors, for which performance may be improved by providing a boosted voltage. A voltage limiting device may be used to control the gate of the transmission gate transistor so as to prevent the boosted voltage from reaching a level which would overstress the gate oxide of the transistor.

A top view of a grounded-gate voltage limiting device is shown in FIG. 1. A gate polysilicon layer 10 extends above a drain electrode 12 that is formed by diffusing n-type dopant into a semiconductor substrate 14. The semiconductor substrate is a p-substrate, which is held at ground potential. The areas surrounding the drain electrode 12 have an additional p-type implant to prevent lateral leakage to adjacent transistors. That is, the p-type implant is a field stop implant. The device may include a source 16, but no connections are made to the source, thereby allowing the source to "float."

While not shown, the polysilicon gate layer 10 is spaced apart from the drain electrode 12 by a gate oxide layer. An opening is formed in a dielectric layer, not shown, that is atop the drain electrode. The opening permits direct contact of a metallic interconnect 18 with the drain electrode.

The voltage limiting device of FIG. 1 is shown schematically in FIG. 2. The metallic interconnect 18 is shown as an input node. The input node may be connected to a source of a boosted voltage to regulate the voltage. For example, a program mode voltage for an EPROM may be regulated using the device. When the program mode voltage is sufficiently low, a breakdown will not occur and no current will flow from the drain electrode 12 to the grounded gate 10. Upon reaching the breakdown voltage, current begins to flow from the drain electrode to the substrate 14. The initiation of current flow limits the voltage at the input node.

Ideally, the device clamps the program mode voltage at the breakdown voltage of the device, so that any increase in power results in increased current while the voltage remains fixed. Steep current-voltage (I-V) curves are obtainable, but practical limitations prevent designers from achieving the ideal. Referring to FIG. 3, the breakdown voltage of the device of FIG. 1 is reached at approximately 13.8 volts. Below this voltage level, no current flows from the metallic interconnect 18 to the grounded substrate 14. Beyond the breakdown voltage, there is control of voltage increases, but the control is significantly improved only upon reaching approximately 15.3 volts. That is, the current-voltage (I-V) characteristics of the device are significantly improved after the voltage at the metallic interconnect 18 reaches 15.3 volts.

In many applications, the lower portion 20 of the I-V curve may have no adverse effect on the desired protection of other circuitry. Where the circuitry to be protected is able to withstand voltages up to 18 volts or more, the device of FIG. 1 may be reliably employed. On the other hand, circuitry that is damaged or rendered less reliable by voltage levels exceeding 14 volts are not provided adequate protection by the device of FIG. 1.

It is an object of the present invention to provide a grounded-gate voltage limiting device having improved I-V characteristics.

SUMMARY OF THE INVENTION

The above object has been met by a voltage limiting device in which the configuration of a gate electrode, a drain electrode, or both provides an array of breakdown corners that increases the voltage-clamping capability of the device. The breakdown corners are traversals of the gate electrode over the boundary of the source or drain electrode. An increase in the number of breakdown corners increases the steepness of an I-V curve.

It has been discovered that a relatively high resistance is still encountered at the breakdown voltage of a grounded gate limiting device in which a gate oxide layer separates the gate electrode from the drain electrode. As the voltage continues to rise, the resistance is suddenly reduced. This phenomenon has been discovered to be caused by a limitation of conduction to gate corners until the higher voltage is obtained, whereafter conduction occurs across the entire width of the gate. The present invention increases the number of gate corners so as to improve the I-V characteristics of voltage limiting devices.

In a preferred embodiment, the drain electrode is a diffusion region within a semiconductor substrate. A conventional gate oxide layer covers the drain electrode. The gate electrode has a plurality of fingers, with each finger having an interior portion atop the drain electrode and an exterior portion that is beyond the border of the drain electrode. Each finger thereby provides two breakdown corners at which current is conducted when the device is subjected to a breakdown voltage. A sufficient number of fingers are provided to achieve a low effective resistance. Where the number of breakdown corners exceeds 100, the I-V curve is nearly vertical.

Alternatively, the drain electrode may be configured to increase the number of breakdown corners. For example, the drain electrode may have a serpentine pattern that repeatedly passes under the edge of the gate electrode.

An advantage of the present invention is that the effective resistance at the breakdown voltage is sufficiently low that the device has a high clamping capability. Consequently, the voltage limiting device offers greater protection of other circuitry. In turn the protected circuitry is rendered more reliable. Another advantage is that the improved I-V characteristics can be achieved by only modifying the configuration of the polysilicon layer that forms the gate electrode.

BEST MODE FOR CARRYING OUT THE INVENTION

Figure 2:
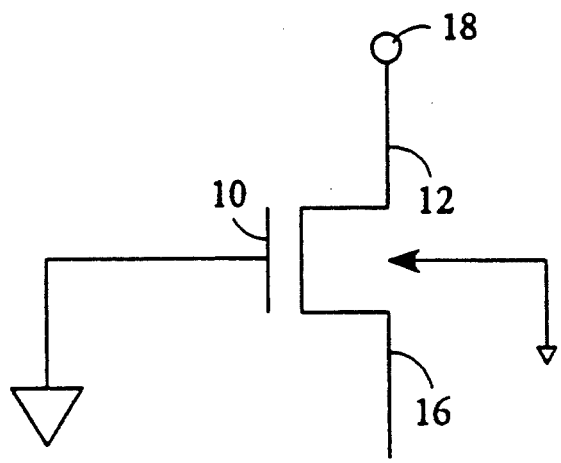
FIG. 2 is a schematic view of a grounded-gate voltage limiting device in accordance with both the prior art and the present invention.

With reference to FIG. 2, the schematic view of a grounded-gate voltage limiting device 24 applies equally to prior art structures and the improvements of the present invention. The drain electrode 12 receives an input at node 18. Because the source 16 is allowed to float, no current flows from the drain to the source. However, applying a voltage above the breakdown voltage will initiate current flow from the drain 12 to the substrate 14. This current flow acts to clamp the voltage applied at the input node 18.

Figure 4:
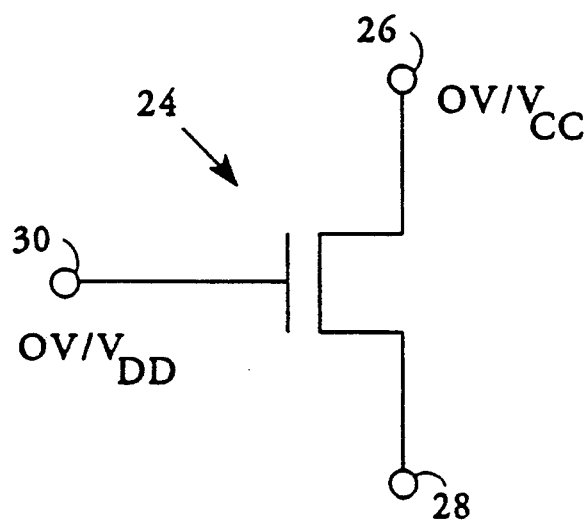
FIG. 4 is a schematic view of a transmission gate as an example of circuitry to be protected by the present invention.

FIG. 4 shows a conventional transmission gate device 24. Such a device is exemplary of circuitry that may be protected by a voltage limiting device. In transmitting a signal from an input node 26 to an output node 28, a greater speed can be achieved by connecting a boosted signal at a gate node 30. The speed of signal propagation from the input node to the output node is dependent upon the boosted signal level at the gate node. A low logic level, i.e. 0 volts, will inhibit signal propagation, while a high logic level, i.e. $V_{DD}$, will provide high speed signal propagation. In FIG. 4, the propagating signal is a digital signal that transitions from the 0 volts to $V_{DD}$. The gate node is selectively switched from 0 volts to $V_{DD}$, wherein $V_{DD}$ is a boosted voltage that may be obtained by utilizing a multiplier.

A reliability concern in use of the transmission gate device 24 of FIG. 4 involves overstressing the gate oxide that is used in fabricating the device. Maintaining the boosted signal $V_{DD}$ at a level between 10 volts and 12 volts is desirable. A properly structured voltage limiting device of FIG. 2 can be utilized to achieve this goal.

Figure 1:
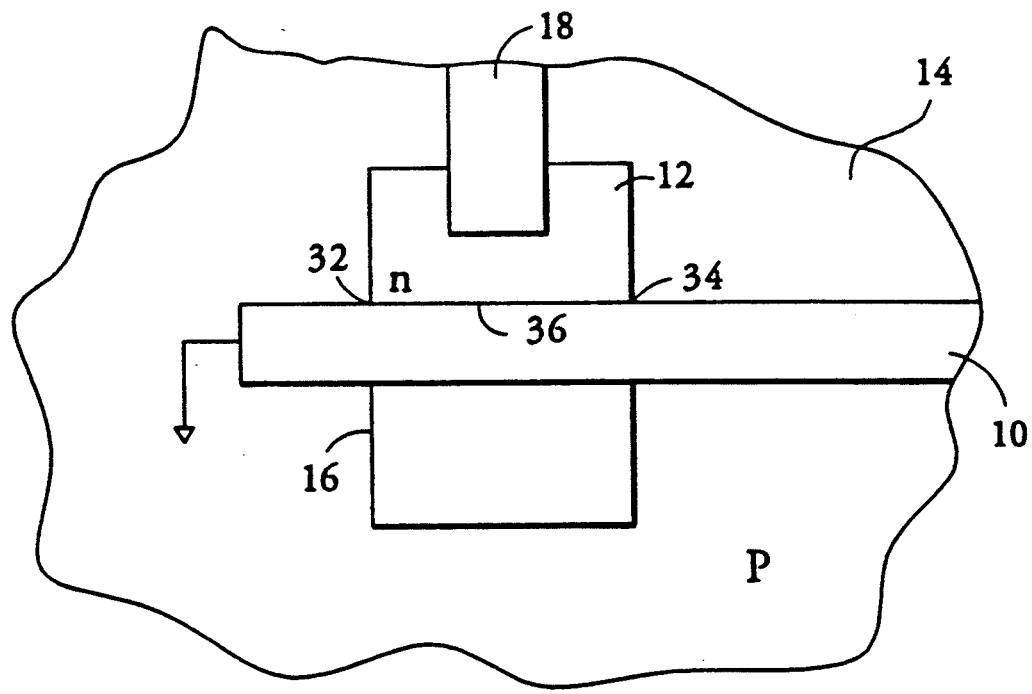
FIG. 1 is a top view of a voltage limiting device in accordance with the prior art.
Figure 3:
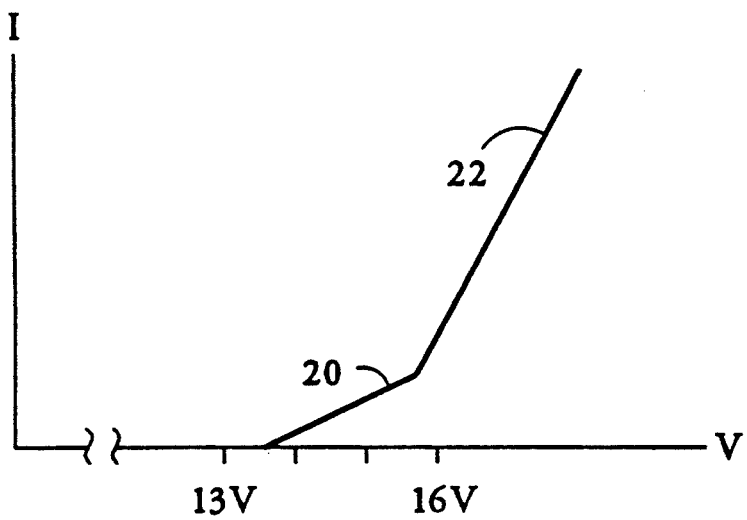
FIG. 3 is a graph of the I-V characteristics of the device of FIG. 1.

As previously described, the I-V characteristic curve 20 and 22 of FIG. 3 is achieved using prior art techniques for fabricating a voltage limiting device. It has been discovered the lower, less steep portion 20 is a result of current flow being limited to portions of the substrate near corners at o crosses the which the edge of a gate polysilicon layer boundary of the drain electrode. In FIG. 1, the corners are at 32 and 34. For purposes of the present invention, these corners will be referred to as "breakdown corners" or "breakdown traversals." It is only after the input at the metallic interconnect 18 reaches a higher voltage that current is conducted between the metallic interconnect and the substrate 14 along the entire edge 36 of the gate layer 10.

Figure 5:
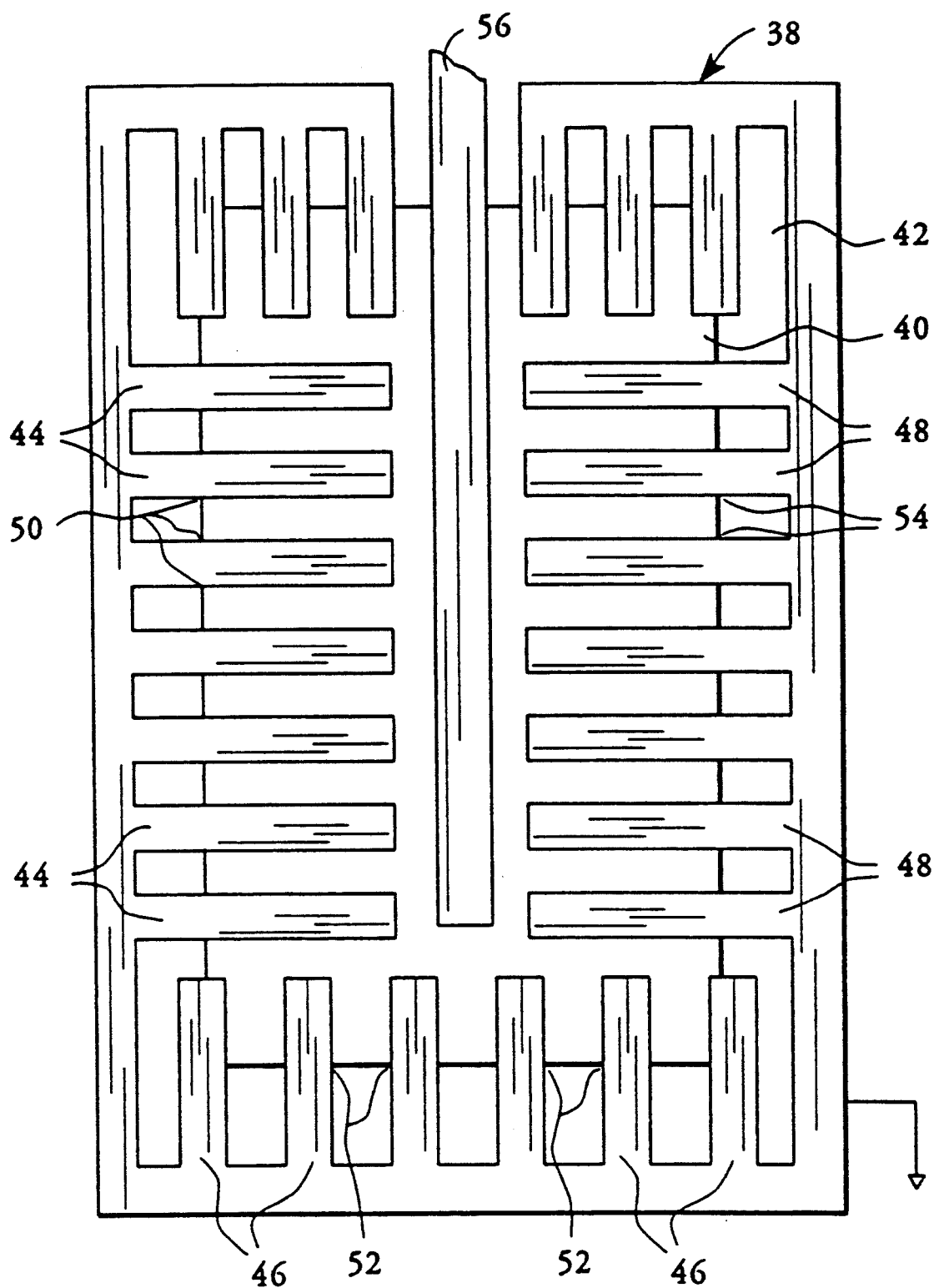
FIG. 5 is a top view of a voltage limiting device having a gate that includes a plurality of fingers in accordance with the present invention.

Referring now to FIG. 5, by increasing the number of breakdown corners at the overlap of a polysilicon gate layer 38 on a drain region 40, the I-V characteristics of a voltage limiting device are improved. The drain region is a diffusion region having an n-type implant. The polysilicon gate layer is grounded. The area about the diffusion region 40 is a p-type field stop region 42.

The polysilicon gate layer 38 is patterned to include an array of fingers 44, 46 and 48. Each finger has opposed edges, with each edge traversing the boundary of the drain region 40 to create a breakdown corner 50, 52 and 54. Thus, rather than being limited to two breakdown corners as in the prior art, the twenty-six fingers 44–48 provide fifty-two breakdown corners 50–54 for the flow of current between a metallic interconnect 56 and the p-type region 42.

Figure 6:
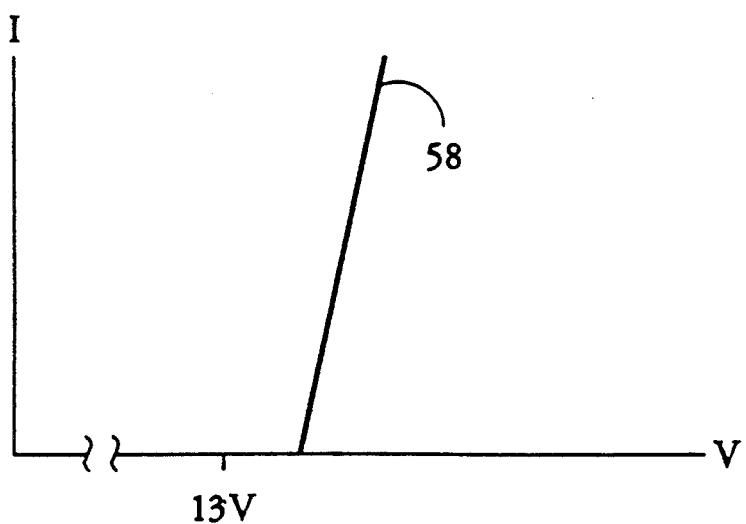
FIG. 6 is a graph of the I-V characteristics of the device of FIG. 5.

The fifty-two-corner structure virtually eliminates the two-tier I-V curve shown in FIG. 3. The effective resistance of the prior art device described above is 4 K ohms in the high resistance region 20 of the curve. Referring to FIG. 6, the embodiment of FIG. 5 provides an I-V curve 58 that offers increased protection. Where the number of breakdown corners is increased to one hundred, a curve that is close to the vertical is exhibited, since the steepness of the curve is increased by fifty times that of a structure having only two breakdown corners. Consequently, the voltage can be clamped at approximately 13.8 volts. Persons of ordinary skill in the art are aware of fabrication procedures for reducing the breakdown voltage so that a lower clamped voltage can be achieved. For example, the doping of the channel region beneath the gate oxide may be increased to lower the breakdown voltage of the device.

Figure 7:
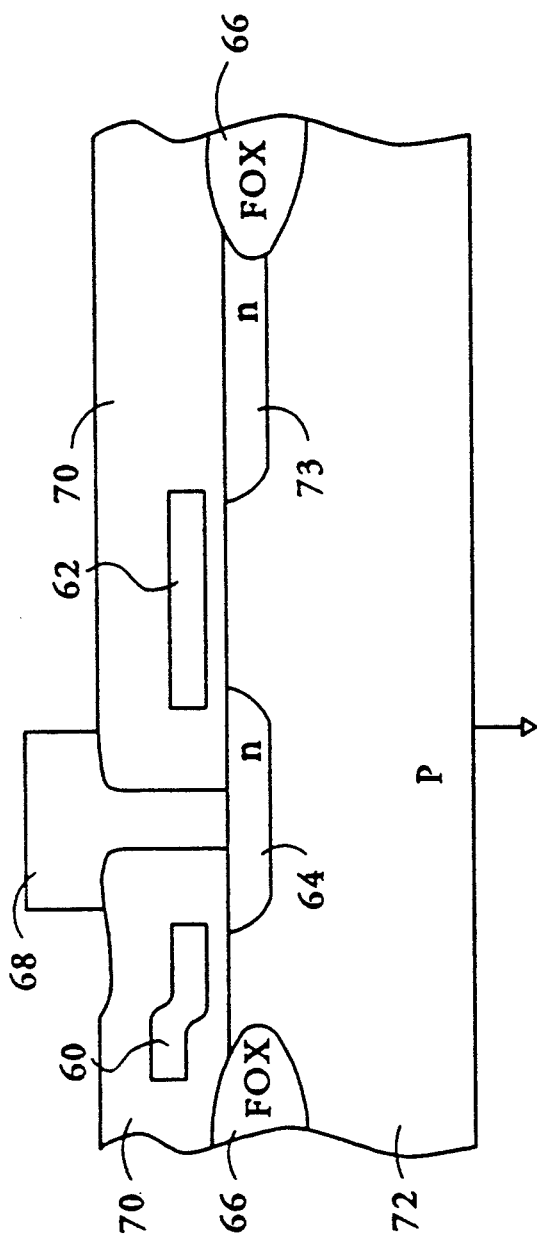
FIG. 7 is a side sectional view of the device of FIG. 5.

The voltage limiting device of FIG. 5 is a sourceless device. However, this is not critical. The device may be fabricated by merely avoiding the source region, as shown in FIG. 7. First and second fingers 60 and 62 of a gate have tips that are atop a drain region 64. Exterior portions of the fingers are removed from the drain region. The first finger 60 is shown over a field oxide region 66.

Between the first and second fingers 60 and 62 is a metallic interconnect 68. An opening in a dielectric layer 70 permits contact of the interconnect with the drain region 64. An input at the interconnect 68 that is above the breakdown voltage of the illustrated device will cause current flow from the interconnect to a p-type substrate 72 via the drain region 64. If the input is of sufficient strength, current flow will be along the entire interior portion of the fingers above the drain region 64. However, as described above, the current flow may be merely at the breakdown corners.

The embodiment of FIG. 7 includes a source region 73. While this source region is present, the region is allowed to float relative to ground potential.

Figure 8:
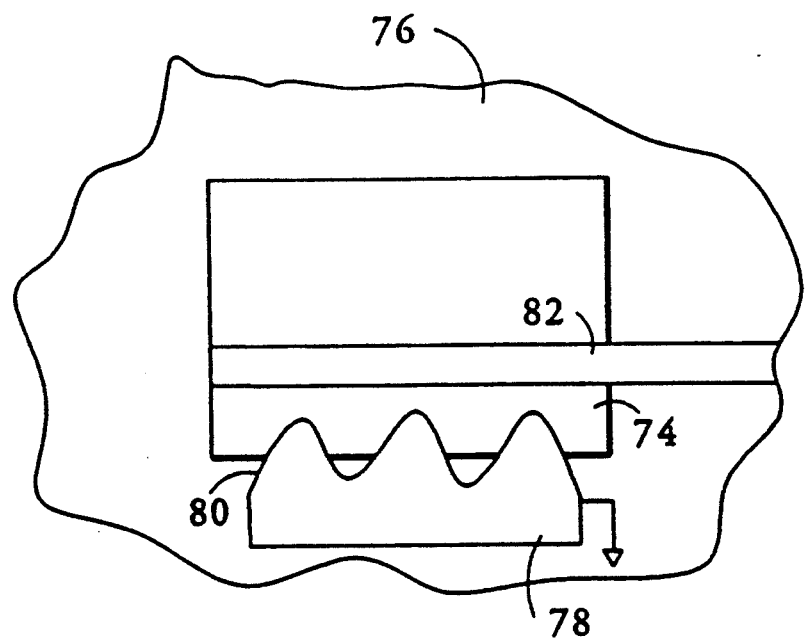
FIG. 8 is a top view of a second embodiment of the present invention.

FIG. 8 illustrates another embodiment of a voltage limiting device in accordance with the present invention. A drain region 74 within a semiconductor substrate 76 is repeatedly overlapped by an edge 80 of a grounded gate 78. The edge 80 has a serpentine configuration. Each point of overlap of the serpentine edge 80 with an edge of the drain region 74 creates a breakdown corner. A metallic interconnect 82 provides an input of a signal to be voltage regulated. The operation is identical to the embodiments described above. When the input at the metallic interconnect 82 initially reaches the breakdown voltage, current flow between the metallic interconnect and the semiconductor substrate 76 is limited to the breakdown corners. Only six breakdown corners are shown in FIG. 8, but preferably the number is significantly greater than six. With each increase in the number of breakdown corners, the effective resistance is reduced. If the strength of the input to the metallic interconnect is increased, the entire portion of the serpentine edge that extends atop the drain region 74 will conduct.

Figure 9:
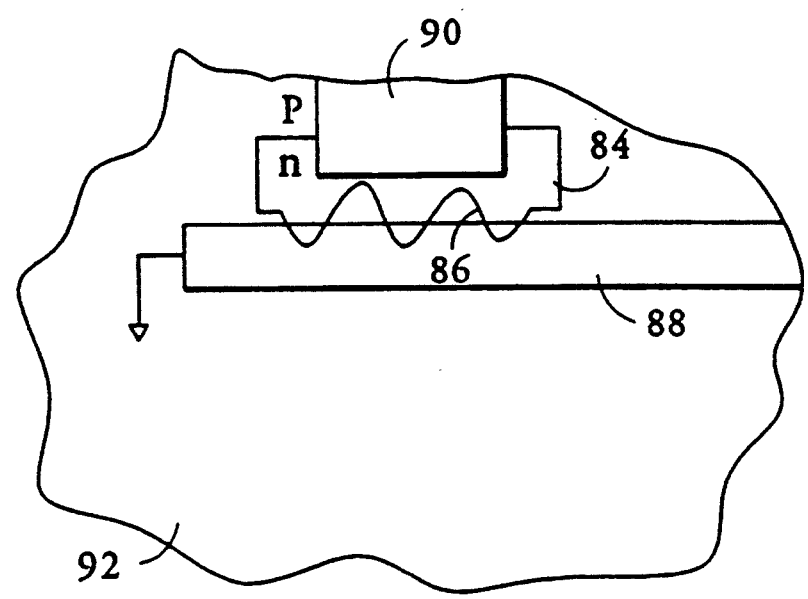
FIG. 9 is a top view of a third embodiment of the present invention.

An alternative to the embodiments described above is to provide a drain region having an edge that repeatedly crosses the boundary of a gate. The operation will be the same as that of the embodiments above. With reference to FIG. 9, a drain region 84 is shown as including a serpentine edge 86 that passes below the edge of a grounded gate 88. A metallic interconnect 90 extends from the drain region 84 to other regions of a semiconductor substrate 92. Again, the configuration of the serpentine edge determines the number of breakdown corners at the overlap of the serpentine edge with the edge of the gate 88. The number of breakdown corners in turn determines the effective resistance to current flow at the breakdown voltage.

Figure 10:
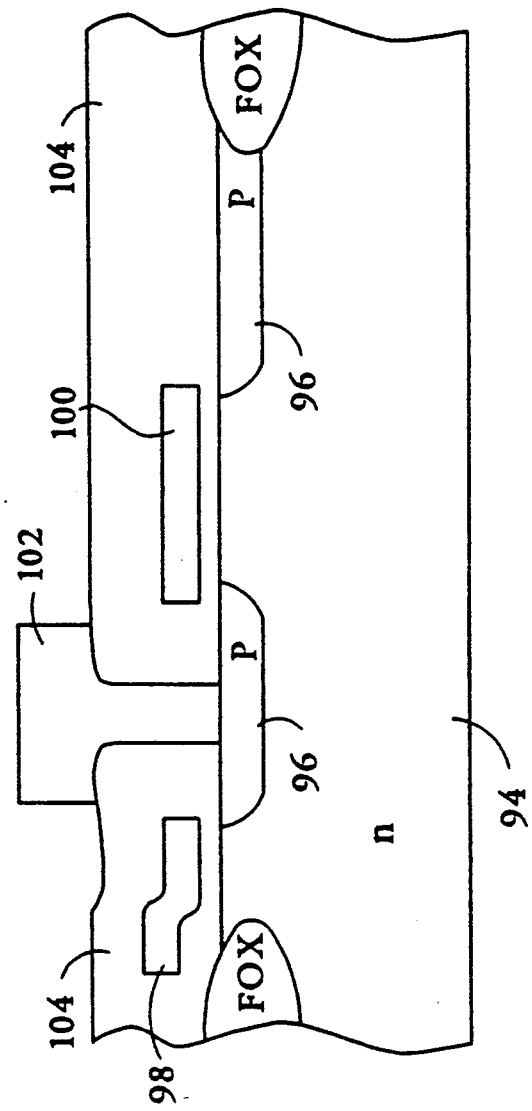
FIG. 10 is a side sectional view of a fourth embodiment of the present invention.

With reference to FIG. 10, another embodiment of the present invention is shown. Rather than an n-channel transistor, the voltage limiting device is a p-channel device. Structurally, the device is similar to that of FIG. 7, with the exception that the semiconductor substrate 94 is of an n-type and the source and drains are p-type regions. Electrically, the potential at the drain 96 is negative with respect to the substrate 94. Two gate fingers 98 and 100 are shown, but the gate electrode is comprised of many additional fingers. The gate is fixed at the same potential as the substrate 94.

A metallic interconnect 102 extends through a dielectric layer 104 to contact the drain 96. A signal to be voltage controlled is introduced at the interconnect 102.

In operation, when the potential difference between the signal at the interconnect 102 and the voltage of the substrate 94 and the gate fingers 98 and 100 is below the breakdown voltage of the device, current will not flow between the substrate and the interconnect. If the potential difference reaches the breakdown voltage, current will flow from the substrate 94 to the interconnect 102. The current flow will be only at the breakdown corners on opposed sides of the fingers 98 and 100. The limitation of current at the breakdown corners will not adversely affect operation of the device if there are a sufficient number of breakdown corners provided by the multi-finger gate. A gate having fifty fingers to provide one hundred breakdown corners will achieve a nearly vertical I-V curve.

The present invention has been described as having source/drain regions within a semiconductor substrate of a uniform type. Operationally, the substrate region surrounding a source/drain region may be itself a diffused region within an opposite type bulk substrate. For an n-channel device, this would be a p-type diffused well region within an n-type bulk substrate. On the other hand, for a p-channel device, an n-type well would be diffused within a p-type bulk substrate. Operation of the resulting structure would be the same as that described above.

I claim:

1. A voltage limiting device comprising, a substrate having a first electrode region and having a semiconductive substrate area adjacent to said first electrode region, a second electrode disposed above said substrate and having a plurality of fingers, each finger having a tip disposed above said first electrode region and having an exterior portion disposed above said semiconductive substrate area, said second electrode and a part of said semiconductive substrate area distal to said first electrode region being substantially fixed at a first voltage level, input means connected to said first electrode region for supplying an input signal to be voltage-regulated, and an insulator layer spacing apart said tip of each finger from said first electrode region to form a structure having a plurality of breakdown corners near which current flows from said input means to said substrate when a potential difference between said input means and said first voltage level exceeds a breakdown voltage.

2. The device of claim 1 wherein said first electrode region is a drain region and said second electrode region is a gate, said gate being fixed at the substrate potential.

3. The device of claim 1 wherein each finger is spaced apart from adjacent fingers, the number of said fingers being greater than four.

4. The device of claim 1 wherein said input means is a metal interconnect.

5. The device of claim 1 wherein said insulator layer is a gate oxide layer.

6. The device of claim 5 wherein said first electrode region is a semiconductor region having a diffusion of dopant, said second electrode being a gate polysilicon layer on said gate oxide layer.

7. The device of claim 1 wherein each finger has opposed edges, each edge crossing a boundary of said first electrode region at a breakdown corner, said breakdown corners being a point of current flow when said potential difference between said input means and said first voltage level is at said breakdown voltage.

8. A voltage limiting device comprising, a semiconductor substrate having a drain region and a fixed substrate potential distal to said drain region and having a gate electrode separated from said substrate and said drain region by a dielectric layer, said gate and drain region including a configuration wherein said gate electrode has a boundary crossing over a boundary of said drain region in at least three locations forming a pattern of breakdown traversals between said drain region and said gate electrode, said breakdown traversals being corners of overlap of said boundaries of said gate and drain region, said gate electrode fixed at said substrate potential, and an input means connected to said drain region for conducting an input signal to said drain region, wherein said gate and drain region have a breakdown voltage at which current flow from said drain region to said substrate is substantially limited to areas proximate to said breakdown traversals, said current flow providing clamping of said input signal when said input signal has a voltage level exceeding said breakdown voltage.

9. The device of claim 8 wherein said drain region is a doped region of said semiconductor substrate and wherein said gate electrode is a conductive layer on said semiconductor substrate.

10. The device of claim 8 wherein said drain region boundary includes a serpentine configuration, which said gate electrode boundary crosses over in at least three locations.

11. The device of claim 8 wherein said gate electrode boundary includes a serpentine configuration, which crosses over said drain region boundary in at least three locations.

12. The device of claim 8 wherein said semiconductor substrate includes a source electrode, said source electrode being electrically floated.

13. A voltage limiting device comprising,
a semiconductor substrate having a drain region adjoining a channel region at a boundary,
an insulator layer disposed on parts of said drain region, said channel region and said boundary, and
a polysilicon gate disposed on said insulator layer and having a plurality of spaced apart fingers extending from areas above said drain region to areas above said channel region, thereby providing a gate-aided breakdown structure having at least four corners at which said polysilicon gate has an edge traversing said boundary between said drain region and said channel region.

14. The device of claim 13 wherein said drain region is a diffused region.

15. The device of claim 13 wherein said polysilicon gate is electrically coupled to a gate of a transmission gate structure.

16. The device of claim 13 wherein said fingers are at least four in number.

17. The device of claim 13 wherein said polysilicon gate is fixed at ground potential.

* * * * *